United States Patent [19]

Logue

[11] Patent Number: 5,404,101
[45] Date of Patent: Apr. 4, 1995

[54] ROTARY SENSING DEVICE UTILIZING A ROTATING MAGNETIC FIELD WITHIN A HOLLOW TOROID CORE

[76] Inventor: Delmar L. Logue, R.R. #1, Herrick, Ill. 62431

[21] Appl. No.: 842,244

[22] Filed: Feb. 27, 1992

[51] Int. Cl.⁶ .......................... G01B 7/30; G01B 7/14; H02K 3/04; H01F 15/02
[52] U.S. Cl. .............................. 324/207.17; 310/168; 318/661; 324/207.25; 324/207.26; 336/45
[58] Field of Search ....................... 324/207.17, 207.18, 324/207.19, 207.22, 207.25, 207.26, 232; 310/68 B, 168, 171; 318/653, 660, 661; 336/45, 83, 130, 131

[56] References Cited

U.S. PATENT DOCUMENTS

| | | | |
|---|---|---|---|
| 3,518,595 | 6/1970 | Dawson et al. | 336/134 |
| 3,609,531 | 9/1971 | Forster | 324/232 X |
| 3,611,345 | 10/1971 | Pintell | 324/207.17 X |
| 3,876,932 | 4/1975 | Domon et al. | 324/232 X |
| 4,008,450 | 2/1977 | Argoudelis | 336/132 |
| 4,064,473 | 12/1977 | Seilly | 336/83 |
| 4,210,859 | 7/1980 | Meretsky et al. | 323/44 R |
| 4,255,682 | 3/1981 | Toida et al. | 310/168 |
| 4,268,786 | 5/1981 | Rohrle | 318/661 |
| 4,379,261 | 4/1983 | Lakin | 324/232 X |
| 4,445,103 | 4/1984 | Chass | 336/135 |
| 4,529,922 | 7/1985 | Ono | 318/603 |
| 4,529,956 | 7/1985 | Atherton | 336/83 |
| 4,672,347 | 6/1987 | Garcia et al. | 336/132 |
| 4,792,756 | 12/1988 | Lam et al. | 324/232 |
| 4,962,331 | 10/1990 | Smith | 310/261 |

FOREIGN PATENT DOCUMENTS 0065302   3/1988   Japan .................... 324/207.17

OTHER PUBLICATIONS

Look To Motion Control For Manufacturing Solutions, Edward J. Dunne, Design News, Aug. 5, 1991, p. 45.
Control Engineering, Products Preview, Sep., 1991, p. 86.
Resolver Signal Requirements For High Accuracy Resolver-To-Digital Conversion, IEEE Transactions On Industrial Electronics, vol. 37, No. 6, Dec. 1990, pp. 556–561.

*Primary Examiner*—Gerard R. Strecker
*Attorney, Agent, or Firm*—Haverstock, Garrett & Roberts

[57] ABSTRACT

A rotary sensing device for indicating the angular displacement of a shaft is disclosed which comprises a magnetic core member formed of ferromagnetic material, a first winding wound within the core member for producing a first magnetic field in a closed path throughout the core, a second winding wound around the core member for producing a second magnetic field in a closed path throughout the core, the first and second magnetic fields being orthogonal to each other, and a pick-up coil assembly associated with the magnetic core member, the magnetic fields, and the shaft for sensing angular displacement of the shaft. A proximity sensor for sensing the passage of an object and the direction of passage of the object is also disclosed.

22 Claims, 4 Drawing Sheets

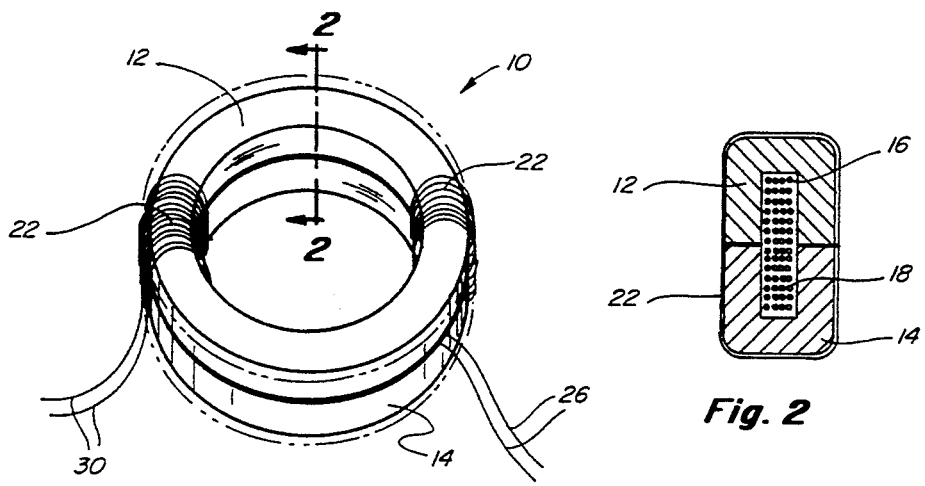
Fig. 1
Fig. 2
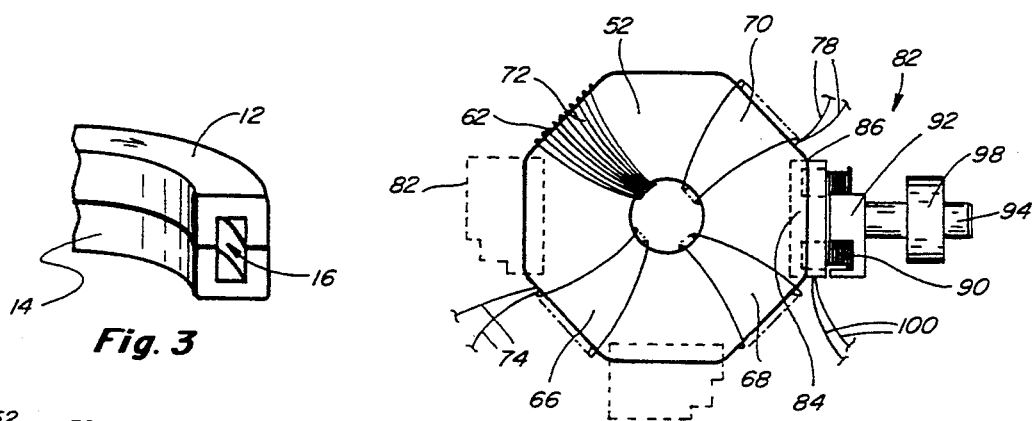
Fig. 3
Fig. 4
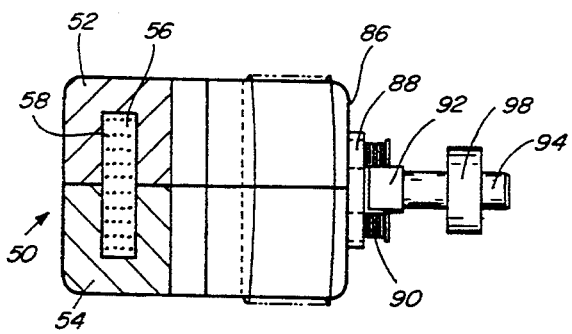
Fig. 5
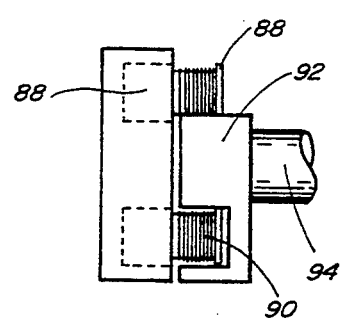
Fig. 6
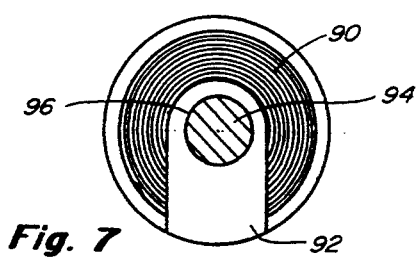
Fig. 7

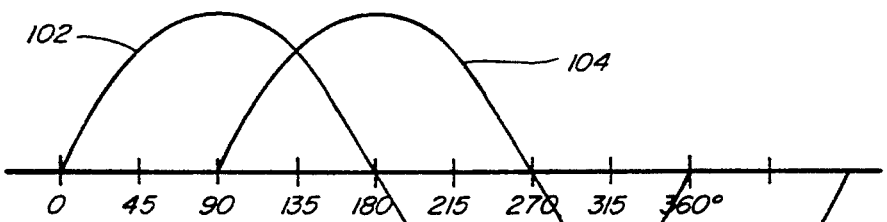
Fig. 8
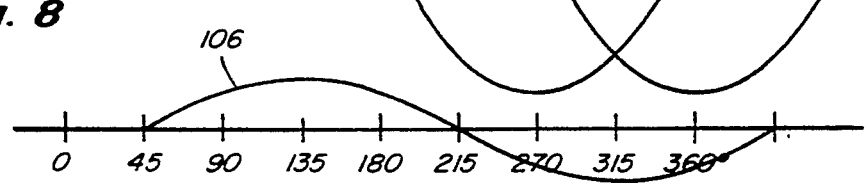
Fig. 9
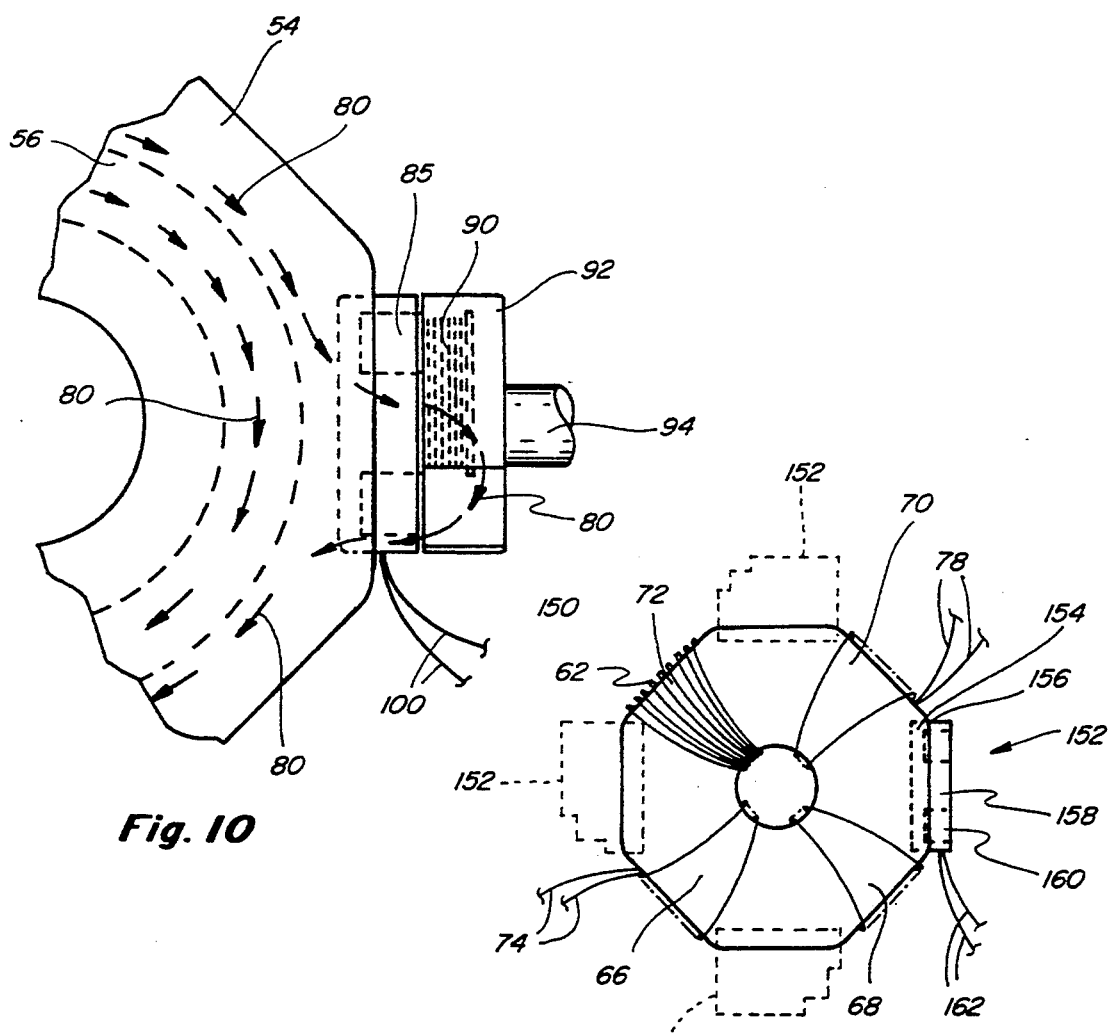
Fig. 10
Fig. 11

ROTARY SENSING DEVICE UTILIZING A ROTATING MAGNETIC FIELD WITHIN A HOLLOW TOROID CORE

BACKGROUND OF THE INVENTION

The present invention relates to a rotary sensing device such as a resolver and more particularly to a rotary sensing device having a constant amplitude output with a phase shifted output.

A resolver is a device, also known as a rotary inductor or a rotary transformer, which is used to provide output signals which vary as a function of the angular displacement of a rotating shaft. The resolver is typically constructed of a stator member and a rotor member. The stator member has one or more primary coils and the rotor has one or more secondary coils. The magnetic coupling between the stator and the rotor coils is varied by rotation of a rotating member, such as a shaft, on which the rotor is mounted. One advantage of the resolver is the infinite resolution of the output voltages for any angular position of the rotor with respect to the stator.

A resolver is constructed by creating a mechanical structure that has two inductances which are sinusoidal and cosinusoidal functions of position respectively. When an A.C. current is applied to the structure windings, the voltages induced in these inductances have sinusoidal and cosinusoidal envelopes with respect to position. The position information contained in these two phase voltages are typically decoded by a resolver-to-digital (R/D) converter to give the shaft position of the resolver in digital form.

Resolvers are also constructed with either a wound or nonwound rotor. Conventional resolvers are constructed with a wound rotor that is excited with an A.C. voltage through slip rings and brushes or a rotating transformer. The stator of a conventional resolver has two phases that are in spatial quadrature. As the rotor turns, the mutual coupling between the excited rotor and the stator phases is designed to have the desired sinusoidal and cosinusoidal distributions.

To control various rotary devices resolvers have been used to determine the exact angular position of a shaft of the rotary device. Such resolvers are precision devices and require extensive fabrication in order to obtain the desired precision. The cost to manufacture such resolvers is very expensive. Additionally, in the past resolvers have been constructed with various intricate windings methodologies which are quite complex and costly to manufacture.

Variable-reluctance (VR) resolvers are constructed with a salient, nonwound rotor whose angular position determines the inductance of two stator phases which are in spatial quadrature. Excitation of the resolver may be accomplished by placing additional windings on the stator phases. In contrast with with the conventional resolver, whose mutual inductance exhibits zero average value, the inductances of a VR resolver are never negative and therefore have a nonzero average value. This implies that the voltages induced across the stator windings contain an undesired constant amplitude component in addition to the desired sinusoidal and cosinusoidal envelope waveforms. Before being processed by an R/D converter, this undesired component is eliminated electrically.

There are various ways that the signals generated by a resolver can differ from the ideal situation. As stated in Duane C. Hanselman's article "Resolver Signal Requirements for High Accuracy Resolver-to-Digital Conversion" which appeared in IEEE Transactions on Industrial Electronics, Vol. 37, No. 6, December 1990, pp. 556–561, the most commonly occurring nonideal characteristics are amplitude imbalance, quadrature error, inductance harmonics, reference phase shift, excitation signal distortion, and disturbance signals. Imperfect quadrature between the two resolver signals refers to the situation when the two resolver inductances are not exactly Pi/2 radians out of phase with each other. This can occur when the two resolver phases are not machined or assembled in perfect spatial quadrature. It has also been shown that it is generally impossible to construct a resolver with inductance profiles that are perfect sinusoidal and cosinusoidal functions of position. The inductances will contain harmonics. The nonideal characteristics of amplitude imbalance, reference phase shift, excitation signal distortion, and disturbance signals are minimized through careful engineering practice and design. However, the other error sources, quadrature error and inductive harmonics have been difficult to minimize. Therefore, in resolver applications there is a need to minimize quadrature error and inductive harmonics.

Another application of rotary sensing device is that of a proximity sensor. Proximity sensors are devices which are used to detect the presence of metal objects and typical applications include counting items stamped out by stamping machinery, the passage of amusement park rides, missing parts detection, and detection of elevators. Signals are generated when a metal object passes by the sensor. A typical inductive proximity sensor consists of four basic elements which are a coil, an oscillator, a trigger circuit, and an output switching device. The oscillator produces a radio frequency which is emitted by the coil out from the face of the sensor. If a metal object enters the radio frequency field eddy currents will circulate within the metal object. Energy is required from the oscillator to maintain the eddy currents in the metal object. As the metal object moves closer to the face of the sensor, the eddy currents increase which causes a greater load on the oscillator. If the load becomes too great the oscillator will cease which causes the trigger circuit sensing the oscillator to change the state of the output switching device. Although the proximity sensor is a useful device in that it indicates the passage of an object it does not provide additional information which would be helpful in controlling automated production equipment. For example, it would be useful to provide information such as the direction of travel of the metal object. If for some reason the metal object is passing the sensor in the wrong direction this could cause the automated equipment to malfunction and be damaged. If the direction that the metal object passes the sensor could be monitored a signal could be produced to shut down the automated equipment to avoid damaging the equipment. Therefore, it would be advantageous to provide a proximity sensor which is of simple construction and capable of indicating the direction an object has passed the sensor.

SUMMARY OF THE INVENTION

The resolver or rotary sensing device for indicating the angular displacement of a shaft of the present invention comprises a magnetic core member formed of ferromagnetic material, first inductive means for producing a first magnetic field in a closed path throughout the core, second inductive means for producing a second magnetic field in a closed path throughout the core, the first and second magnetic fields being orthogonal to each other, and means associated with the magnetic core member, the magnetic fields, and the shaft for sensing angular displacement of the shaft.

In another embodiment of the present invention a rotary sensing device for indicating the angular displacement of shafts comprises a toroid member having a hollow core, a first winding wound within the hollow core, a second winding wound around the outside of the toroid member, the first and second windings being in an orthogonal relationship with each other, means for applying excitation signals to the first and second windings, and means associated with the core, the windings, and the shafts for sensing the angular displacements of the shafts.

A further embodiment of the present invention discloses a proximity sensor which comprises a magnetic core member formed of ferromagnetic material, first inductive means for producing a first magnetic field in a closed path throughout the core, second inductive means for producing a second magnetic field in a closed path throughout the core, the first and second magnetic fields being orthogonal to each other, and means associated with the magnetic core member and the magnetic fields for indicating the passing of an object and the direction of travel of the object.

By producing a resolver or a proximity sensor according to the present invention, the sensing winding, which an output is taken from the resolver to determine the angular displacement of a shaft or taken from the proximity sensor to determine the passage of an object, can be produced on a conventional bobbin winding machine. This reduces the cost of producing the resolver or the proximity sensor and does not require retooling in order to manufacture the resolver or the proximity sensor. Additionally, this decreases the requirement for precision manufacturing of the sensing winding and also decreases the requirement for testing during the manufacturing process of the resolver or the proximity sensor.

In light of the foregoing comments, it will be recognized that a principal object of the present invention is to provide a resolver of simple construction and design and which can be easily employed with highly reliable results.

Another object of the invention is to provide a resolver device in which the phase of the output signal varies linearly with the angular displacement of a rotating sensing element.

A still further object of the invention is to provide a resolver device in which the accuracy of the output signal is constant over its operating range.

Another object of the invention is to provide a resolver device in which quadrature error and inductive harmonics are minimized.

Another principal object of the invention is to provide a proximity sensor of simple construction and design and which can be easily employed with highly reliable results.

Another object of the invention is to provide an inductor core for a resolver or a proximity sensor which requires lower excitation currents due to there being no air gaps in the magnetic circuits.

These and other objects and advantages of the present invention will become apparent after considering the following detailed specification in conjunction with the accompanying drawings, wherein:

BRIEF DESCRIPTION OF THE DRAWINGS

FIG. 1 is a perspective view of an inductor which forms a part of a preferred embodiment of a resolver constructed according to the present invention;

FIG. 2 is an enlarged cross sectional view of the inductor shown in FIG. 1 taken along the plane of line 2—2 of FIG. 1;

FIG. 3 is a partial fragmentary view of the core of the inductor shown in FIG. 1;

FIG. 4 is a top view of a preferred embodiment of a resolver of the present invention;

FIG. 5 is a side view of the resolver shown in FIG. 4 shown partially in cross section;

FIG. 6 is an enlarged partial view of the pick-up coil assembly of the resolver shown in FIG. 4;

FIG. 7 is a front view of the pick-up coil assembly shown in FIG. 6;

FIG. 8 is a graph of the input signals applied to the primary windings of the resolver shown in FIG. 4;

FIG. 9 is a graph of the output of the pick-up coil assembly shown in FIG. 4;

FIG. 10 is an enlarged partial view of the resolver of FIG. 4 shown partially in cross section;

FIG. 11 is a perspective view of a preferred embodiment of a proximity sensor constructed according to the present invention;

DETAILED DESCRIPTION OF THE PREFERRED EMBODIMENT

Figure 14:
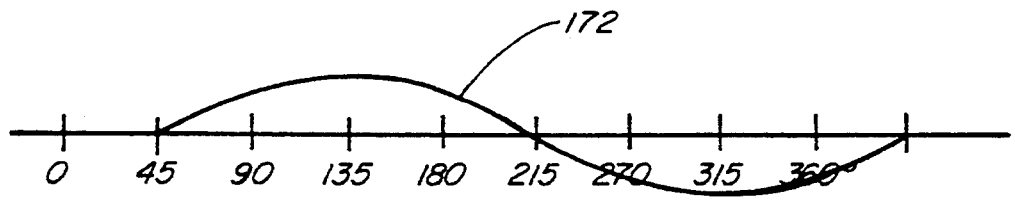
FIG. 14 is a graph of the output of the pick-up coil assembly shown in FIG. 11.

Referring now to the drawings, wherein like numerals refer to like items, number 10 identifies an inductor which forms a preferred embodiment of a resolver of the present invention. Referring now in particular to FIGS. 1–3, the inductor 10 includes two hollow coaxial generally cylindrical core sections 12 and 14 of ferrite or other material of high magnetic permeability. Although a pair of core sections 12 and 14 are shown it is also contemplated that a single core section be employed. Within the core sections 12 and 14 is a hollow portion 16 within which is wound a first winding 18. A second winding 22 is wound around the outside of the core sections 12 and 14.

Input leads 26 are connected to the first winding 18. Input signals, such as from an excitation voltage source (not shown), are applied over the leads 26 of the first winding 18. Input leads 30 are connected to the second winding 22. Input signals, such as from an excitation voltage source (not shown), are applied over the leads 30 of the second winding 22.

The winding 18 forms a first closed magnetic circuit and the winding 22 forms a second closed magnetic circuit. The first and second closed magnetic circuits each exist orthogonally to one another in the same core. The two orthogonal magnetic field components produce a constant length magnetic flux vector which rotates a full 360° about the core. This rotating flux vector exists in every particle of the core material. This results in the flux density remaining constant during the entire rotating flux cycle. It simply changes polarity orthogonally with the first and second windings 18 and 22 sharing the magnetic domains (sine and cosine) in a perpendicular arrangement.

The flux level is at a constant at all times. If the magnetic flux lines and the windings of a coil are in the same plane no voltage is induced in the coil. Even if the flux level is changing because the windings are in the same plane, no linking will occur.

Referring now to FIGS. 4 and 5, a preferred embodiment of a resolver 50 is illustrated. The resolver 50 is constructed according to the principles previously discussed with respect to the inductor 10 as shown in FIGS. 1-3. In particular, resolver 50 includes two hollow generally C-shaped core sections 52 and 54 of ferrite or other material of high magnetic permeability. The C-shaped core sections 52 and 54 are octogonal in shape and the reason for this shape will be explained. Within the core sections 52 and 54 is a hollow portion 56 within which is wound a first winding 58. A second winding 62 is wound around the outside of the core sections 52 and 54. The winding 62 is wound equally around the core sections 52 and 54 at four equally spaced apart positions 66, 68, 70, and 72.

Input leads 74 are connected to the first winding 58. Input signals, such as from an excitation voltage source such as a sine-cosine excitation voltage source (not shown), are applied over the leads 74 of the first winding 58. Input leads 78 are connected to the second winding 62. Input signals, such as from an excitation voltage source (not shown), are applied over the leads 78 of the second winding 62.

The winding 58 forms a first closed magnetic circuit and the winding 62 forms a second closed magnetic circuit. The first and second closed magnetic circuits each exist orthogonally to one another in the same core. The two orthogonal magnetic field components produce a constant length magnetic flux vector which rotates a full 360° about the core. This rotating flux vector exists in every particle of the core material. This results in the flux density remaining constant during the entire rotating flux cycle. It simply changes polarity orthogonally with the first and second windings 58 and 62 sharing the magnetic domains (sine and cosine) in a perpendicular arrangement. Although the octogonal shape is preferred, other shaped cores are also possible.

The resolver 50 further includes a pick-up coil assembly 82 which may be totally or partially positioned within a bore 84 on a side 86 of the resolver 50. The pick-up coil assembly 82, which is shown in more detail in FIGS. 6 and 7, includes a pick-up core 88 around which is wound a pick-up coil 90. The pick-up coil assembly 82 further includes a pick-up rotor 92. A shaft 94 may be designed to fit within a bore 96 of the pick-up coil assembly 82 and the pick-up rotor 92 or the shaft 94 may be positioned to be adjacent to the pick-up coil assembly 82. The shaft 94 is formed of a non-magnetic material such as stainless steel or even a non-metalic material such as nylon and is supported for rotation by bearings 98. The pick-up coil 90 includes a pair of wires 100 which are used to receive an output signal of the resolver 50. Additionally, a capacitor (not shown) can be placed across the pair of wires 100 to allow the pick-up coil 90 resonate at the excitation frequency. The output signal of the pick-up coil assembly 82 is much higher when tuned to resonance by adding a capacitor of proper size. Additional pick-up coil assemblies 82 may be used with the resolver 50 with some of the possible positions of additional assemblies 82 shown in phantom in FIG. 4. It is to be understood that the pick-up coil assemblies 82 may be positioned anywhere on the core as long as the divisions of winding 62 are in symmetry with each assembly 82 for purposes of nulling.

The operation of the resolver 50 can be best understood with reference to FIGS. 4 and 8-9. FIG. 8 depicts a waveform 102 which represents the input excitation signal which is supplied to the second winding 62 of the resolver 50 and a waveform 104 which represents the input excitation signal which is supplied to the first winding 58 of the resolver 50. FIG. 9 illustrates the output signal 106 of the resolver 50 taken from the wires 100 of the pick-up coil assembly 82. As the shaft 94 rotates the displaced angle is sensed by the pick-up coil assembly 82 of the resolver 50 with the output of the resolver appearing over the wires 100. As can be seen from FIG. 9, the output signal 106 is a sine wave having a constant amplitude. The output signal 106 is a function of the angular displacement of the shaft 94 and has an amplitude which is constant and is phase shifted. The phase shift of the output signal 106 is 0° to 360° with linear tracking of the displacement of the shaft 94.

FIG. 10 depicts lines of flux 80 entering and leaving a stator 85 of the pick-up coil assembly 82. The lines of flux 80 enter the stator 85 uniformly around the stator 85 to improve linearity of the output signal 106.

FIG. 11 illustrates the use of the resolver 50 as a proximity sensor 150. The proximity sensor 150 is similar in design and construction to the resolver 50 with the principal differences being that the shaft 94 and its associated bearings 98 and the pick-up rotor 92 are not included in the construction of the proximity sensor 150. The proximity sensor 150 includes the two core sections 52 and 54 within which is wound the first winding 58. The second winding 62 is wound around the outside of the core sections 52 and 54. The winding 62 is wound equally around the core sections 52 and 54 at four equally spaced apart positions 66, 68, 70, and 72.

Input leads 74 are connected to the first winding 58. Input signals, such as from an excitation voltage source (not shown), are applied over the leads 74 of the first winding 58. Input leads 78 are connected to the second winding 62. Input signals, such as from sine-cosine excitation source (not shown), are applied over the leads 78 of the second winding 62.

Figure 12:
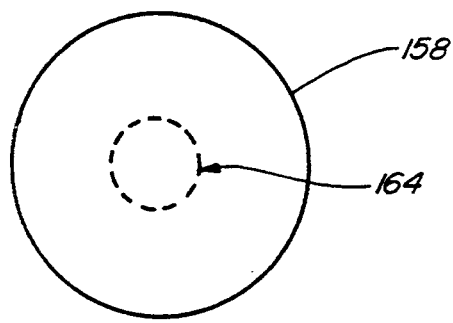
FIG. 12 is an enlarged front view of the pick-up coil assembly shown in FIG. 11.

The proximity sensor 150 further includes a pick-up coil assembly 152 which is positioned within a bore 154 on a side 156 of the proximity sensor 150. The pick-up coil assembly 152, which is shown in more detail in FIG. 12, includes a pick-up core 158 around which is wound a pick-up coil 160. The pick-up coil 160 includes a pair of wires 162 which are used to receive an output signal of the proximity sensor 150. The pick-up core 158 and the pick-up coil 160 present a face portion 164 which is adjacent to the path of travel of an object to be detected or sensed. Additionally, a capacitor (not shown) can be placed across the pair of wires 162 to allow the pick-up coil 160 resonate at the excitation frequency. The output signal of the pick-up coil assembly 152 is much higher when tuned to resonance by adding a capacitor of proper size. Additional pick-up coil assemblies 152 may be used with the proximity sensor 150 with the positions of additional assemblies 152 shown in phantom in FIG. 11. The additional assemblies 152 may be used on the proximity sensor 150 without interacting or interfering with the other assemblies 152. Additionally, assemblies 152 may be positioned anywhere on the core as long as the divisions of winding 62 are in symmetry with each assembly 152 for purposes of nulling.

Figure 13:
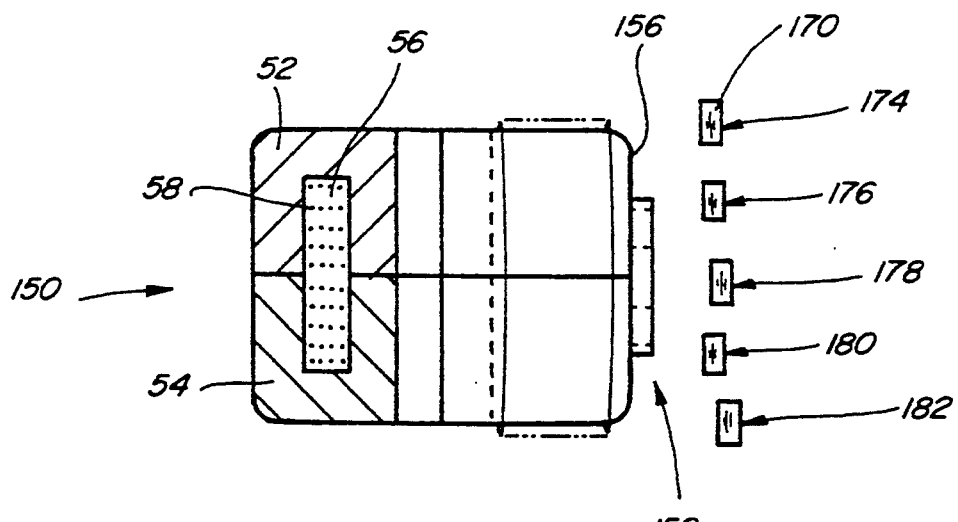
FIG. 13 is a perspective view of the proximity sensor shown in FIG. 11 with a target passing the sensor at various positions.

The operation of the proximity sensor 150 can be best understood with reference to FIGS. 13 and 14. FIG. 13 illustrates various positions of a target disk 170, such as a ferrite or iron powder target disk, as the target disk 170 passes in front of the pick-up coil assembly 152 and more particularly the face portion 164. When the target disk 170 passes in front of the pick-up coil assembly 152 an output signal, such as output signal 172 shown in FIG. 14, is generated over the wires 162. When the target disk 170 is at a position 174 which is a position just prior to the target disk 170 being adjacent to the pick-up coil assembly 152 no signal is produced by the proximity sensor 150. This is indicated in FIG. 14 by the section of the graph between 0° and 45°. When the target disk 170 is at a position 176 which is a position adjacent to the upper portion of the pick-up coil 160 the output signal of the pick-up coil assembly 152 is at a maximum positive value. This is indicated in FIG. 14 at the 135° point on the graph. When the target disk 170 is at a position 178 which is a position adjacent to the center of the pick-up coil 160 the output signal of the pick-up coil 160 is at a zero value. This is indicated in FIG. 14 at the 215° point of the graph. When the target disk 170 is at a position 180 which is a position adjacent to the lower portion of the pick-up coil 160 the output signal will be at a maximum negative value. This is indicated in FIG. 14 at the 315° point on the graph. When the target disk 170 is at a position 182 which is a position when the target disk 170 is not adjacent to the pick-up coil 160 there is no output signal generated by the proximity sensor 150. This is indicated at 405° point on the graph. As can be appreciated, the target 170 may pass adjacent to the pick-up coil 160 at any angle and the output signal will be the output signal 172.

The output signal 172 is a function of both the detection of an object and the direction of travel of the object. For example, if the target disk 170 were to travel in an opposite direction as previously described then the output signal would be reversed. The direction information in the output signal is beneficial in that a computer can be programmed to receive the output signal and if the output signal is the opposite of what is expected then the computer can shut down the machine to avoid a malfunction of the machine.

Additionally, if nonferrous metals are used as targets the output signal from the proximity sensor would be shifted 180° out of phase as compared to ferrous metal targets. For example, the output signal 172 as shown in FIG. 13 would be shifted by 180°. The amplitude of the output signal would also be lower, about 50% lower, when nonferrous metals are being sensed.

Figure 15:
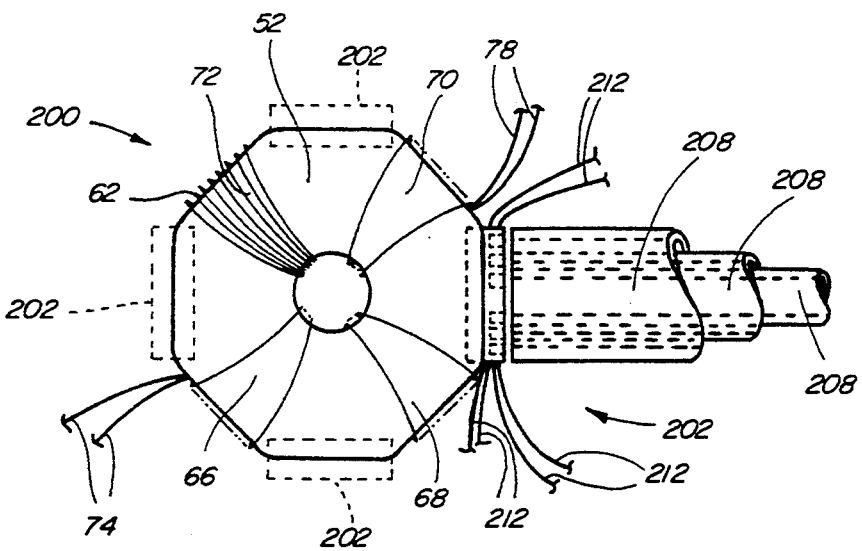
FIG. 15 is a perspective view of a second preferred embodiment of a resolver of the present invention.
Figure 16:
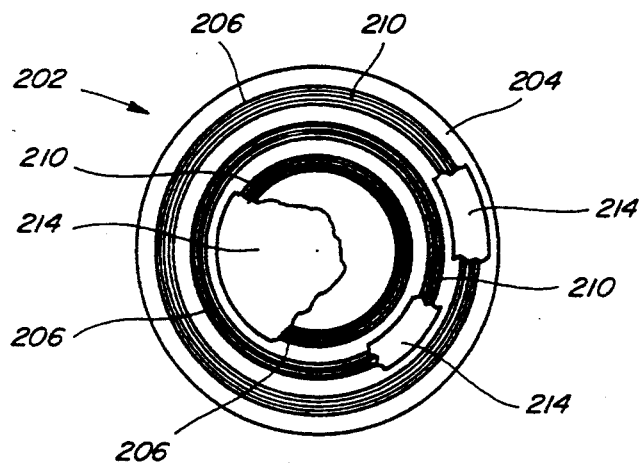
FIG. 16 is an enlarged front view of the pick-up coil assembly shown in FIG. 15.

Referring now to FIGS. 15 and 16, a polyphase resolver 200 of the present invention is shown. The polyphase resolver 200 is similar in design to the resolver 50 with the principal differences being the construction of the pick-up coil assembly 202 and the polyphase resolver 200 is adapted to sense the angular displacements of concentric shafts. The polyphase resolver 200 has the same inductor design or portion as shown in FIGS. 4 and 5 and the same reference numbers have been used. The pick-up coil assembly 202 of the polyphase resolver 200 has a pick-up core 204 having a number of concentric grooves 206 with the number of concentric grooves 206 equal to the number of concentric shafts to be sensed. In this example there are three concentric shafts 208. Placed within each of the grooves 206 are coils 210. Each of the coils 210 has output wires 212 for receiving output signals. Pick-up rotors 214 are associated with each of the coils 210 and the shafts 208. Additional pick-up coil assemblies 202 may be used with the polyphase resolver 200 and these additional pick-up coil assemblies 202 are shown in phantom in FIG. 15.

The operation of resolver 200 is similar to that of resolver 50 however since there are additional pick-up coils there will be additional outputs with each output indicating the angular displacement of the particular shaft 208 being sensed. The waveforms 102 and 104, as depicted in FIG. 8, are examples of excitation signals use to excite the primary windings 58 and 62 of the resolver 200. As each of the shafts 208 rotates the displaced angle is sensed by the respective pick-up coil assemblies 202 with each of the outputs appearing over the wires 212. The waveform 106, as illustrated in FIG. 9, is an example an output signal appearing over the wires 212.

Figure 17:
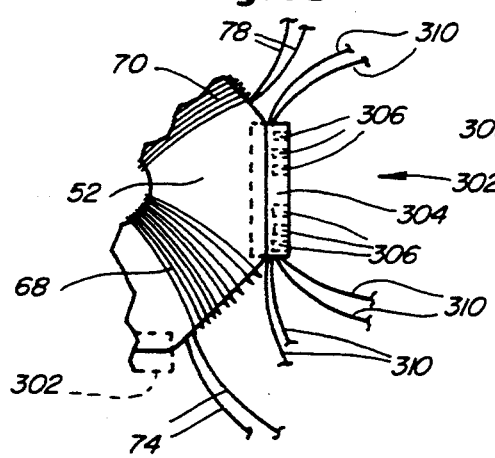
FIG. 17 is a partial perspective view of a second preferred embodiment of a proximity sensor of the present invention.
Figure 18:
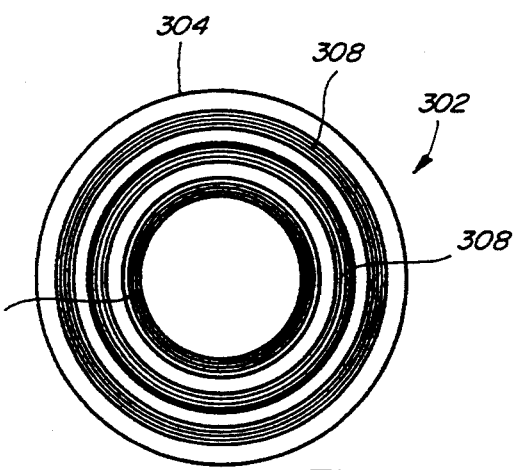
FIG. 18 is an enlarged front view of the pick-up coil assembly shown in FIG. 17.

FIGS. 17 and 18 show a polyphase proximity sensor 300 which is similar in design to the proximity sensor 150 with the principal difference being the construction of the pick-up coil assembly 302. The polyphase proximity sensor 300 uses the same inductor design or portion as shown in FIGS. 11 and 13. The pick-up coil assembly 302 of the polyphase proximity sensor 300 has a pick-up core 304 having a number of grooves 306. Placed within each of the grooves 306 are pick-up coils 308 which are used to sense the passing of a target object or objects. Each of the pick-up coils 308 has a pair of output wires 310 for receiving output signals.

The operation of proximity sensor 300 is similar to that of proximity sensor 150 however since there are additional pick-up coils there will be additional outputs with each output indicating the passing of a target object and the direction of passage of the target object. The waveforms 102 and 104, as depicted in FIG. 8, are examples of excitation signals use to excite the primary windings 58 and 62 of the proximity sensor 300. A target object passing in front of the proximity sensor is sensed by the respective pick-up coil assemblies 302 with each of the outputs appearing over the wires 310. The waveform 106, as illustrated in FIG. 9, is an example an output signal appearing over the wires 310. The polyphase proximity sensor 300 provides more information than proximity sensor 150. The phase differences between the output signals from the pick-up coils 308 more accurately indicate the approach angle of the target object and the distance the target object is from the proximity sensor 300.

From all that has been described, it will be clear that there has been shown and described herein a resolver and a proximity sensor which fulfill the various objects and advantages sought therefor. It will be apparent to those skilled in the art, however, that many changes, modifications, variations, and other uses and applications of the subject resolver or proximity sensor are possible and contemplated. All changes, modifications, variations, and other uses and applications which do not depart from the spirit and scope of the invention are deemed to be covered by the invention, which is limited only by the claims which follow.

What is claimed is:

1. A rotary sensing device for indicating the angular displacement of a shaft by means of detecting a phase shift of a constant amplitude sine-wave signal, the device comprising:

a hollow toroid core formed of ferromagnetic material having an octogonal shaped outer circumference, the hollow toroid core also having sides with at least one of the sides having a bore therein;

a first excitation winding wound within the hollow toroid core for inducing a first magnetic field throughout the hollow toroid core, the winding including a pair of leads extending out of the hollow toroid core;

a second excitation winding wound around the outside of the hollow toroid core at four spaced positions, the second excitation winding for inducing a second magnetic field throughout the hollow toroid core, the winding including a pair of leads, the first and second excitation windings being orthogonal to each other throughout the hollow toroid core;

a sine-cosine excitation signal being applied to each of the leads of each of the first and second excitation windings to induce a rotating magnetic field throughout the hollow toroid core; and a pick-up coil assembly mounted in the bore, the pick-up coil assembly comprising a pick-up core around which is wound a sensing coil having a pair of leads, a pick-up rotor mounted to the shaft, the pick-up rotor magnetically coupled with the pick-up core, and an output signal being produced over the pair of leads of the sensing coil representative of the position of the pick-up rotor which corresponds to the angular displacement of the shaft.

2. The rotary sensing device of claim 1 wherein the pick-up coil assembly is partially positioned within the bore.

3. The rotary sensing device of claim 1 wherein the hollow toroid core is separable.

4. The rotary sensing device of claim 1 wherein the shaft is rotatably mounted by at least one bearing.

5. The rotary sensing device of claim 1 further comprising a second shaft, a second bore disposed in another of the sides, a pick-up coil assembly mounted in the second bore, the pick-up coil assembly comprising a pick-up core around which is wound a sensing coil having a pair of leads, a pick-up rotor mounted to the second shaft, the pick-up rotor magnetically coupled with the pick-up core, and a second output signal being produced over the pair of leads of the sensing coil indicative of the position of the pick-up rotor which corresponds to the angular displacement of the second shaft.

6. The rotary sensing device of claim 1 further comprising a plurality of shafts, a plurality of bores disposed in other sides of the toroid core, a pick-up coil assembly mounted in each of the bores, each of the pick-up coil assemblies comprising a pick-up core around which is wound a sensing coil having a pair of leads, a pick-up rotor mounted to a corresponding shaft, the pick-up rotor magnetically coupled with the pick-up core, and output signals being produced over each of the pairs of leads of the sensing coils representative of the position of each of the pick-up rotors which corresponds to the angular displacement of each of the shafts.

7. The rotary sensing device of claim 1 wherein a capacitor is connected in parallel with the pick-up coil leads for tuning the resonant frequency of the sine-cosine excitation signal applied to the each of the leads of the first and second excitation windings.

8. The rotary sensing device of claim 1 wherein the pick-up coil assembly is mounted completely within the bore.

9. A poly-phase resolver for indicating the angular displacements of a plurality of concentric shafts by means of a plurality of phase shift sine-wave signals, the resolver comprising:

a hollow toroid core formed of ferromagnetic material having an octogonal shaped outer circumference, the hollow toroid core also having sides with at least one of the sides having a bore therein;

a first excitation winding wound within the hollow toroid core for inducing a first magnetic field throughout the hollow toroid core, the winding including a pair of leads extending out of the hollow toroid core;

a second excitation winding wound around the outside of the hollow toroid core at four spaced positions, the second excitation winding for inducing a second magnetic field throughout the hollow toroid core, the winding including a pair of leads, the first and second excitation windings being orthogonal to each other throughout the hollow toroid core;

a sine-cosine excitation signal being applied to each of the leads of each of the first and second excitation windings to induce a rotating magnetic field throughout the hollow toroid core; and a poly-phase pick-up coil assembly mounted in the bore, the pick-up coil assembly comprising a pick-up core having a number of grooves with the number of grooves equal to the number of concentric shafts, a sensing coil positioned within each of the grooves with each of the sensing coils having a pair of leads, a number of rotors with the number of rotors equal to the number of concentric shafts and one rotor mounted to each of the concentric shafts, each of the rotors magnetically coupled with each of the sensing coils, and an output signal being produced over each of the pair of leads of each of the sensing coils representative of the position of each of the pick-up rotors which corresponds to the angular displacement of each of the concentric shafts.

10. The poly-phase resolver of claim 9 wherein the poly-phase pick-up coil assembly is partially positioned within the bore.

11. The poly-phase resolver of claim 9 wherein the hollow toroid core is separable.

12. The poly-phase resolver of claim 9 wherein each of the concentric shafts are each rotatably mounted by at least one bearing.

13. The poly-phase resolver of claim 9 further comprising a second concentric shaft, a second bore disposed in another of the sides, a poly-phase pick-up coil assembly mounted in the second bore, the poly-phase pick-up coil assembly comprising a pick-up core having a number of grooves with the number of grooves equal to the number of concentric shafts, a sensing coil positioned within each of the grooves with each of the sensing coils having a pair of leads, a number of rotors with the number of rotors equal to the number of concentric shafts and one rotor mounted to each of the concentric shafts, each of the rotors magnetically coupled with each of the sensing coils, and an output signal being produced over each of the pair of leads of each of the sensing coils representative of the position of each of the pick-up rotors which corresponds to the angular displacement of each of the concentric shafts.

14. The poly-phase resolver of claim 9 further comprising a plurality of concentric shafts, a plurality of bores disposed in the sides of the core, a poly-phase pick-up coil assembly mounted in each of the bores, each of the poly-phase pick-up coil assemblies comprising a pick-up core having a number of grooves with the number of grooves equal to the number of concentric shafts, a sensing coil positioned within each of the grooves with each of the sensing coils having a pair of leads, a number of rotors with the number of rotors equal to the number of concentric shafts and one rotor mounted to each of the concentric shafts, each of the rotors magnetically coupled with each of the sensing coils, and an output signal being produced over each of the pair of leads of each of the sensing coils representative of the position of each of the pick-up rotors which corresponds to the angular displacement of each of the concentric shafts.

15. The poly-phase resolver of claim 9 wherein a capacitor is connected in parallel with the pick-up coil leads for tuning the resonant frequency of the sine-cosine excitation signal applied to the each of the leads of the first and second excitation windings.

16. The poly-phase resolver of claim 9 wherein the poly-phase pick-up coil assembly is mounted completely within the bore.

17. A proximity sensor for indicating a direction of movement of a target with respect to the sensor by means of detecting a phase angle of an output signal and a distance the target is from the sensor by means of detecting an amplitude of the output signal, the sensor comprising:
   a hollow toroid core formed of ferromagnetic material having an octogonal shaped outer circumference, the hollow toroid core also having sides with at least one of the sides having a bore therein;
   a first excitation winding wound within the hollow toroid core for inducing a first magnetic field throughout the hollow toroid core, the winding including a pair of leads extending out of the hollow toroid core;
   a second excitation winding wound around the outside of the hollow toroid core at four spaced positions, the second excitation winding for inducing a second magnetic field throughout the hollow toroid core, the winding including a pair of leads, the first and second excitation windings being orthogonal to each other throughout the hollow toroid core;
   a sine-cosine excitation signal being applied to each of the leads of each of the first and second excitation windings to induce a rotating magnetic field throughout the hollow toroid core; and
   a pick-up coil assembly mounted in the bore, the pick-up coil assembly comprising a pick-up core around which is wound a sensing coil having a pair of leads, and an output signal being produced over the pair of leads of the sensing coil with the phase angle of the output signal representing the direction of travel of the target with respect to the sensor and the amplitude of the output signal representing the distance the target is from the sensor as the target moves by the pick-up coil assembly.

18. The proximity sensor of claim 17 further comprising a second bore disposed in another of the sides, a pick-up coil assembly mounted in the second bore, the pick-up coil assembly comprising a pick-up core around which is wound a sensing coil having a pair of leads with a second output signal being produced over the pair of leads of the sensing coil when a second target moves by the pick-up coil assembly mounted in the second bore.

19. The proximity sensor of claim 17 further comprising a plurality of bores disposed in the sides of the core, a pick-up coil assembly mounted in each of the bores, each of the pick-up coil assemblies comprising a pick-up core around which is wound a sensing coil having a pair of leads with an output signal being produced over each of the pairs of leads of the sensing coils when a target moves by a corresponding one of the pick-up coil assemblies with the phase angle of each of the output signals representing the direction of travel of the target with respect to the sensor and the amplitude of each of the output signals representing the distance the target is from the sensor as the target moves by a corresponding one of the pick-up coil assemblies.

20. A poly-phase proximity sensor for indicating a direction of movement of a target with respect to the sensor by means of detecting a phase angle of an output signal and a distance the target is from the sensor by means of detecting an amplitude of the output signal, the sensor comprising:
   a hollow toroid core formed of ferromagnetic material having an octogonal shaped outer circumference, the hollow toroid core also having sides with at least one of the sides having a bore therein;
   a first excitation winding wound within the hollow toroid core for inducing a first magnetic field throughout the hollow toroid core, the winding including a pair of leads extending out of the hollow toroid core;
   a second excitation winding wound around the outside of the hollow toroid core at four spaced positions, the second excitation winding for inducing a second magnetic field throughout the hollow toroid core, the winding including a pair of leads, the first and second excitation windings being orthogonal to each other throughout the hollow toroid core;
   a sine-cosine excitation signal being applied to each of the leads of each of the first and second excitation windings to induce a rotating magnetic field throughout the hollow toroid core; and
   a pick-up coil assembly mounted in the bore, the pick-up coil assembly comprising a pick-up core having grooves, a sensing coil positioned within each of the grooves with each of the sensing coils having a pair of leads, and an output signal being produced over each of the pair of leads of each of the sensing coils with the phase angle of each of the output signals representing the direction of travel of a corresponding target with respect to the sensor and the amplitude of each of the output signals representing the distance the target is from the sensor as the target moves by its respective pick-up coil assembly.

21. The proximity sensor of claim 20 further comprising a second bore disposed in another of the sides, a pick-up coil assembly mounted in the second bore, the pick-up core assembly comprising a pick-up core having grooves, a sensing coil positioned within each of the grooves with each of the sensing coils having a pair of leads, and a second output signal being produced over each of the pair of leads of each of the sensing coils with the phase angle of each of the output signals representing the direction of travel of a corresponding target with respect to the sensor and the amplitude of each of the output signals representing the distance the target is from the sensor as the target moves by its respective pick-up coil assembly.

22. The proximity sensor of claim 20 further comprising a plurality of bores disposed in the sides of the core, a pick-up coil assembly mounted in each of the bores, each of the pick-up coil assemblies comprising a pick-up core having grooves, a sensing coil positioned within each of the grooves with each of the sensing coils having a pair of leads, and output signals being produced over each of the pairs of leads of each of the sensing coils with the phase angle of each of the output signals representing the direction of travel of a corresponding target with respect to the sensor and the amplitude of each of the output signals representing the distance the target is from the sensor as the target moves by its respective pick-up coil assembly.

\* \* \* \* \*